(12) United States Patent
Shimizu et al.

(10) Patent No.: US 8,512,816 B2
(45) Date of Patent: Aug. 20, 2013

(54) METHOD OF FABRICATING THIN FILM BY MICROPLASMA PROCESSING AND APPARATUS FOR SAME

(75) Inventors: Yoshiki Shimizu, Ibaraki (JP); Takeshi Sasaki, Ibaraki (JP); Kazuhiro Kirihara, Ibaraki (JP); Kazuo Terashima, Ibaraki (JP); Naoto Koshizaki, Ibaraki (JP); Davide Mariotti, NewtownAbbey (GB)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 456 days.

(21) Appl. No.: 12/438,164

(22) PCT Filed: Jul. 23, 2007

(86) PCT No.: PCT/JP2007/064411
§ 371 (c)(1),
(2), (4) Date: May 23, 2011

(87) PCT Pub. No.: WO2008/023523
PCT Pub. Date: Feb. 28, 2008

(65) Prior Publication Data
US 2012/0021132 A1    Jan. 26, 2012

(30) Foreign Application Priority Data
Aug. 22, 2006 (JP) .................. 2006-225695

(51) Int. Cl.
*C23C 16/513* (2006.01)
*C23C 4/12* (2006.01)

(52) U.S. Cl.
USPC ........... 427/446; 427/569; 427/453; 427/455; 118/715; 118/723 R

(58) Field of Classification Search
None
See application file for complete search history.

(56) References Cited

FOREIGN PATENT DOCUMENTS

| | | |
|---|---|---|
| JP | 2003-328138 A | 11/2003 |
| JP | 2003328138 | * 11/2003 |
| JP | 2004-220935 A | 8/2004 |
| JP | 2005-262111 A | 9/2005 |
| JP | 2006-060130 A | 3/2006 |
| JP | 2006-104545 A | 4/2006 |

* cited by examiner

Primary Examiner — Joseph Miller, Jr.
(74) Attorney, Agent, or Firm — Howson & Howson LLP

(57) ABSTRACT

Provided is a method of fabricating, with satisfactory adhesion, a thin film of a metal or a metallic-compound, such as a metal oxide or nitride, on a substrate made of a high-melting-point material such as silicon or ceramics by using a metal or metallic-compound target as the primary raw material so as to eliminate the necessity of using harmful gases such as organometallic gas, and by using an atmospheric-pressure plasma generated under atmospheric pressure as a reaction field and also as a heat source. Additionally provided is an apparatus for fabricating the thin film. The thin-film fabrication method by microplasma processing includes the steps of disposing a raw material for thin-film fabrication in one or more tubes (A) having a uniform inner diameter throughout, introducing an inert gas and applying a high-frequency voltage to the narrow tubes (A) to generate high-frequency plasma in the narrow tubes (A), heating/evaporating the raw material while maintaining the flow rate of the plasma gas in the narrow tubes (A) and maintaining the plasma gas temperature high, ejecting the evaporated material from the narrow tubes (A) to spray it onto the substrate, heating the substrate with the plasma, and depositing the sprayed material on the substrate under atmospheric pressure.

16 Claims, 14 Drawing Sheets a					b a b

METHOD OF FABRICATING THIN FILM BY MICROPLASMA PROCESSING AND APPARATUS FOR SAME

TECHNICAL FIELD

The present invention relates to technology for fabricating an inorganic material thin film of metal, oxide, nitride or the like on a substrate in the atmosphere without using harmful raw material gas.

BACKGROUND ART

When fabricating an inorganic material thin film of metal, oxide, nitride or the like, the vacuum deposition method, the sputtering method, the chemical vapor deposition method (CVD method) and the like are primarily used.

With the vacuum deposition method and the sputtering method, a block or a plate of metal or oxide as the raw material for deposition is set in a chamber (vacuum vessel), the inside of the chamber is evacuated, an inert gas such as argon or nitrogen or a reactive gas such as oxygen is supplied to maintain the inside of the chamber at a given pressure value, the raw material solid is gasified through heating or sputtering, and then the resulting material is deposited on a substrate disposed at a prescribed position in the chamber.

Meanwhile, with the CVD method, a raw material gas is introduced in an evacuated chamber, the gas is decomposed by plasma or heat, and then a thin film is deposited on a substrate. With these methods, it is possible to deposit a thin film uniformly across the entire area of a large-area substrate of which one side is several cm to several ten cm, and these are effective methods that are being used industrially.

Nevertheless, now that the needs for a lighter, thinner, shorter and smaller device are high, demands for the development of technology capable of depositing an inorganic thin film having gas sensor capability and conductive property only on a minute area of several hundred micron to several millimeter square are increasing. With these methods based on conventional technology, it is standard to mask the substrate and then perform vapor deposition, sputtering, or CVD. However, these methods are highly inefficient since the raw material consumption in relation to the deposited area is high, and are extremely uneconomical.

In addition, since these methods require a process to be performed in the vacuum device, it is necessary to introduce a substrate in the chamber, evacuate the chamber, perform gas displacement and so on, and these processes require much time.

Meanwhile, with the method employing a plasma having a diameter of several hundred microns to several mm which can be stably generated under atmospheric pressure, it is possible to directly deposit a material only on a minute area of several hundred μm to several mm square on the substrate, and is considered to be an effective technique for dramatically reducing raw material consumption in comparison to conventional methods. In addition, since the plasma can be generated in the atmosphere, the entire process can be completed in a short period of time. In light of these circumstances, thin-film fabrication technology using a plasma jet that is generated inside and ejected from a nozzle having a diameter of several hundred microns to several mm disposed in the atmosphere has been proposed in the past several years.

Non-Patent Document 1, Non-Patent Document 2 and Patent Document 1 disclose a manufacturing apparatus of a carbonaceous thin film based on the CVD method by using a nozzle-type atmospheric-pressure plasma generator and hydrocarbon gas such as methane.

Moreover, Patent Document 2 proposes technology of irradiating the desired position of an amorphous substrate with a plasma jet generated under atmospheric pressure, and melting and recrystallizing the irradiated area. This technology is a thin film process that uses the plasma generated under atmospheric pressure as the heat source.

Although these methods are effective as technology to fabricate thin-film only on a minute area in the atmosphere, they encounter the following technical restrictions. Specifically, with the method described in Patent Document 1, since the raw material to be supplied to the apparatus is a gaseous species, when considering the processes to be performed in the atmosphere, it is not possible to use a gaseous raw material that is harmful to the human body or the environment. With the process for preparing a metallic thin film from a gaseous raw material, since toxic gas such as organometallic gas is used, the types of thin films that can be fabricated by the method described in Patent Document 1 will be limited.

Further, although the method described in Patent Document 2 is a method that utilizes the heat and high activity of plasma in order to improve the film quality in the atmosphere, it does not relate to technology for depositing a heterogeneous material on the substrate.

As a means for overcoming these problems, the present inventors proposed new technology in Non-Patent Document 3 and Patent Document 3. With these technologies, a metal wire as the raw material is preliminarily inserted into a narrow tube for plasma generation, the metal wire is evaporated or melted with the thermal conduction or the like from the generated plasma, the generated gas phase or droplets are condensed or solidified downstream, and deposited on a substrate disposed downstream of the narrow tube outlet.

However, these methods deposit metal or a material having metal as its primary component in a dot shape having a diameter of 1 to 100 μm and a line shape having a width of 5 to 50 μm on a low-melting-point substrate of which the melting point is 500° C. or lower.

In order to prevent damage to the low-melting-point substrate caused by the heat flux from the plasma, the heat capacity is lowered by reducing the diameter of the plasma to be 100 μm or less. With these methods, the particles generated in the narrow tube will be ejected from the narrow tube, and collide with and be deposited on the substrate surface. In other words, the reaction involved with the size, form, composition and the like of the particles is completed within the narrow tube. After the particles are deposited on the substrate, the characteristics of the particles will not change due to the effect of the plasma. Thus, from the objective of preventing damage of the low-melting-point substrate, this technology aims to reduce the influence of the plasma on the substrate, and specializes in depositing a material on an area having a diameter of 100 μm or less.

In the thin-film fabrication process, the adhesiveness between the thin film and the substrate is an important factor. With the dry process in a vacuum as represented by vacuum deposition, sputtering, ion plating and the like, as a method of improving the adhesive strength of the film, means such as heating the substrate using a substrate heating stage or improving the kinetic energy of the deposition material is being used. In addition, with the dry deposition process under atmospheric-pressure, the thermal spraying method of melting and depositing the deposition material is employed.

With the technology described in Patent Document 3, the substrate surface that is slightly melted and roughened by the heat flux from the plasma is contributing to the adhesiveness of the deposition material. However, although this is effective in a substrate having a melting point of 500° C. or less, the same effect cannot be expected in a high-melting-point substrate of silicon, ceramics or the like.

[Non-Patent Document 1] Y. Shimizu et al. J. Phy. D: Appl. Phys., 36, 2940 (2003)

[Non-Patent Document 2] T. Kikuchi et al. J. Phy. D: Appl. Phys., 37, 1537 (2004)

[Non-Patent Document 3] Y. Shimizu et al. Surf. Coat. Technol., 200, 4251 (2006)

[Patent Document 1] Japanese Patent Laid-Open Publication No. 2003-328138

[Patent Document 2] Japanese Patent Laid-Open Publication No. 2006-060130

[Patent Document 3] Japanese Patent Laid-Open Publication No. 2005-262111

DISCLOSURE OF THE INVENTION

The present invention was devised in view of the foregoing problems. Thus, an object of the present invention is to provide technology of fabricating a thin film of a metal or a metallic compound, such as a metal oxide or nitride, on a substrate with satisfactory adhesion by using a metal or metallic-compound wire as the primary raw material so as to eliminate the necessity of using harmful gases such as organometallic gas, and by using an atmospheric-pressure plasma generated under atmospheric-pressure.

As in the conventional thermal spraying method performed under atmospheric-pressure, the present invention provides an overall system to deposit a thin film by installing the system on a part of a large-scale plasma generator, or an apparatus for performing thin-film deposition, or an existing apparatus. The present invention additionally provides technology enabling the fabrication of a large-area thin film of several $cm^2$ or larger and an apparatus for use in such fabrication.

Plasma is generated in an insulating narrow tube of glass, quartz, ceramics or the like having an inner diameter of several hundred microns to several millimeters disposed in the atmosphere. A metal or metallic-compound wire as the raw material for deposition is inserted into the narrow tube, an inert gas or non-toxic reactive gas is introduced, high-frequency waves are applied, and plasma is thereby generated. The generated plasma is spouted out as a jet from the narrow tube outlet into the atmosphere, and irradiated to an adjacent substrate for deposition. The substrate is heated based on the effect of this irradiation, and the adhesiveness between the deposited material and the substrate is improved based on the substrate heating effect.

The raw material wire inserted into the narrow tube is heated due to the thermal conduction from the plasma generated in the narrow tube and the applied high-frequency waves, and its surface is vaporized. The active species generated by this evaporation reach the substrate for deposition while maintaining their activity. Thus, the following improvements were made to overcome the problems encountered by the technology described in Patent Document 3 and new effects have been achieved. The gas flow rate will increase as it approaches the outlet in a narrow tube that is pinched toward the outlet as described in Patent Document 3. This is obvious from the relationship of the gas volume supplied per unit time and the cross section area in the narrow tube.

As known in plasma science and engineering, since the increase in the gas flow rate leads to a decrease in the plasma gas temperature, the plasma gas temperature will decrease, as it approaches the outlet of a narrow tube that is pinched toward the outlet. In addition, since the miniaturization of the narrow tube will also lead to a decrease in the propagation efficiency of the high-frequency waves that are applied for generating and maintaining the plasma, it is considered that the plasma gas temperature is lower near the outlet with a smaller tube diameter than at the upstream of the narrow tube.

The decrease in the plasma gas temperature that occurs toward the outlet will lead to the condensation of the raw material active species in the nozzle. Specifically, the particles that are deposited on the substrate are particles whose nucleation and growth have been roughly completed within the nozzle. In light of this fact, with the method of Patent Document 3, heating of the substrate using plasma and reaction on the substrate surface cannot be expected.

Accordingly, the present invention provides a thin-film fabrication method by microplasma processing including the steps of disposing a raw material for thin-film fabrication in one or more tubes (A) having a uniform inner diameter throughout, introducing an inert gas and applying a high-frequency voltage to the narrow tubes (A) to generate high-frequency plasma in the narrow tubes (A), heating/evaporating the raw material while maintaining the flow rate of the plasma gas in the narrow tubes (A) and maintaining the temperature of the plasma gas high, ejecting the evaporated material from the narrow tubes (A) to spray it onto the substrate, and heating the resultant deposit and substrate with the plasma under atmospheric pressure.

As an apparatus for realizing the foregoing method, the present invention additionally provides a thin-film fabrication apparatus by microplasma processing including one or more tubes (A) having a uniform inner diameter throughout, a unit for introducing an inert gas and applying a high-frequency voltage to the narrow tubes (A) to generate high-frequency plasma in the narrow tubes (A), a unit for heating/evaporating the raw material for thin-film fabrication disposed in the narrow tubes while maintaining the flow rate of the plasma gas in the narrow tubes (A) and maintaining the plasma gas temperature high, a substrate disposed in the vicinity of the outlet of the narrow tubes (A), and a unit for depositing the material ejected from the outlet of the narrow tubes (A) on the substrate under atmospheric pressure.

The present invention uses a narrow tube having a uniform inner diameter throughout as shown in FIG. 1. The flow rate of plasma gas in this narrow tube is considered to be roughly equal.

In the thin-film fabrication method by microplasma processing described above, hydrogen gas may be introduced together with the inert gas into the one or more tubes (A) to generate high-temperature plasma.

In addition, by disposing a high-frequency application electrode up to the area in the vicinity of the outlet of the narrow tube (A) and/or narrow tube (B), it is possible to maintain the plasma gas temperature high. The high-frequency waves to be applied for generating and maintaining plasma are considered to be propagated roughly uniformly across the entire application area. Accordingly, if high-frequency application electrodes (FIG. 1, reference numeral 1, etc.) are disposed up to the area in the vicinity of the narrow tube outlet, it will be possible to maintain the plasma gas temperature to be high even near the outlet.

Moreover, by disposing electrodes up to the vicinity of the narrow tube outlet, it will be possible to efficiently eject the plasma generated in the narrow tube from the outlet. Thus, it becomes possible to directly irradiate plasma on a substrate that is adjacent to the outlet, and the substrate can thereby be heated efficiently. Further, the raw material active species generated in the narrow tube are able to maintain their activity until they reach the substrate surface even after being ejected from the narrow tube outlet. This is a new effect that may not have been achieved under the technology described in Patent Document 3.

The present invention additionally provides a method and an apparatus for fabricating a quality thin film by controlling the evaporation rate of the raw material wire. With a high evaporation rate, high latent heat is required for the transition from solid to gas, and this will lead to the decrease in the plasma gas temperature. This is not preferable as a means for fabricating a thin film having favorable adhesiveness with the substrate. If oxygen gas is directly supplied into the plasma in the fabrication of a metallic-compound thin film of oxide or the like, evaporation of the raw material wire is promoted, which consequently leads to the decrease in the plasma gas temperature, and it is often difficult to fabricate a quality film.

In light of the above, the present invention additionally provides a thin-film fabrication method by microplasma processing including the steps of disposing a raw material for thin-film fabrication in one or more tubes (A), introducing an inert gas and applying a high-frequency voltage to the narrow tubes (A) to generate high-frequency plasma in the narrow tubes (A), heating/evaporating the raw material while maintaining the flow rate of the plasma gas in the narrow tubes (A) and maintaining the plasma gas temperature high, ejecting the evaporated material from the narrow tubes (A) to spray it onto the substrate, heating the resultant deposit and substrate with the plasma gas under atmospheric pressure, and reacting the deposit on the substrate with the reactive gas to form a compound thin film on the substrate by supplying a reactive gas from the side face with use of narrow tubes (B) other than the narrow tubes (A).

The present invention provides a method and an apparatus for fabricating a metallic compound of oxide or the like by performing thin-film deposition using inert gas and plasma generated with inert gas including gas such as hydrogen without introducing reactive gas such as oxygen or the like into the narrow tube for plasma generation, in which a raw material wire was inserted, and simultaneously introducing a reactive gas such as oxygen from the side face of the plasma irradiation part of the substrate.

With this method, since the deposited thin film will be heated isostatically by plasma irradiation, it will be relatively easy to prepare oxide, nitride or the like of an equilibrium composition.

Accordingly, the present invention is also able to provide a thin-film fabrication apparatus by microplasma processing including a unit for disposing a raw material for thin-film fabrication in one or more tubes (A) and introducing an inert gas and applying a high-frequency voltage to the narrow tubes (A) to generate high-frequency plasma in the narrow tubes (A), a unit for heating/evaporating the raw material for thin-film fabrication disposed in the narrow tubes (A) while maintaining the flow rate of the plasma gas in the narrow tubes (A) and maintaining the plasma gas temperature high, a substrate disposed in the vicinity of the outlet of the narrow tubes (A), a unit for depositing the material ejected from the outlet of the narrow tubes (A) on the substrate under atmospheric pressure, a unit for disposing one or more narrow tubes (B) other than the narrow tubes (A) in the vicinity of the narrow tubes (A) and supplying a reactive gas on and around the deposit on the substrate from the side face with use of the narrow tubes (B), and a unit for causing the deposit on the substrate to react with the reactive gas to form a compound thin film.

The introduction of a conductive gas such as hydrogen into the inert gas as described above will lead to the improvement in the conductivity of the plasma, and this will consequently enable efficient substrate heating. This will also lead to the promotion of the evaporation of the metal or metallic-compound wire inserted into the nozzle.

The present invention also provides a means and an apparatus for fabricating a thin film of a metallic compound with the multistep process described below. In the first step, thin-film deposition is performed by using an inert gas and the plasma generated with the inert gas including gas such as hydrogen. The plasma is turned off after obtaining a thin film having the desired film thickness and area. In the second step, a nozzle in which a high-melting-point oxidation-resistant wire of platinum or the like has been inserted is disposed in the vicinity above the deposited thin film, and plasma generated with an inert gas including a reactive gas such as oxygen is irradiated. In the second step, the thin film formed in the first step will react sufficiently with reactive plasma irradiation, and consequently a metallic-compound thin film of oxide, nitride or the like is obtained.

With these thin-film fabrication methods, thin-film deposition can be performed on a large area of the substrate by scanning the narrow tube or integrating the narrow tubes. These methods are also effective in scanning the integrated narrow tubes or scanning the deposited substrate.

Each of the foregoing methods is a method employing the plasma generated in the narrow tube, and is considered to require the replacement and cleansing of the narrow tubes during the processes. Thus, in order to facilitate the replacement of the narrow tubes, provided is a method of connecting the gas feed pipe and the narrow tube by tightening the O ring to facilitate the attachment and detachment of the apparatus and narrow tubes.

The present invention is also able to provide a thin-film fabrication method by microplasma processing wherein the substrate and the narrow tubes for plasma generation used for depositing the evaporated material on the substrate are subject to relative displacement so as to control the thickness, substance and area of the film to be deposited, and a thin-film fabrication apparatus by microplasma processing for realizing the foregoing method, as well as a thin-film fabrication method by microplasma processing wherein a plurality of the narrow tubes for plasma generation used for depositing the evaporated material on the substrate are aligned along the substrate and the substrate and the narrow tubes are subject to relative displacement so as to control the thickness, substance and area of the film to be deposited and fabricate a large-area thin film, and a thin-film fabrication apparatus by microplasma processing for realizing the foregoing method.

The present invention is also able to provide a thin-film fabrication method by microplasma processing and its apparatus wherein a heterogeneous material is ejected from a plurality of narrow tubes (A) and deposited on the substrate, the substrate is heated with the plasma gas, and a composite material or a compound fabricated from the sprayed heterogeneous material is deposited on the substrate under atmospheric pressure. The present invention involves any combination of features described above.

The present invention is able to provide technology of preparing a thin film of a metal or a metallic compound, such as a metal oxide or nitride, on a substrate with high adhesion by using an atmospheric-pressure plasma generated under atmospheric pressure. Consequently, it is possible to provide a method of fabricating a thin film of a metal or a metallic compound, such as a metal oxide or nitride, by using a metal or a metallic compound as the primary raw material without using a harmful gas such as an organometallic gas as the raw material or without using a large-scale plasma generator and a raw material feed unit, which were conventionally required.

BRIEF DESCRIPTION OF THE DRAWINGS

FIG. 6 is a schematic view of the plasma generation method for thin-film deposition; wherein FIG. 6(a) shows the generation method using a clip-type electrode, FIG. 6(b) shows the generation method using a plate-shaped electrode, and FIG. 6(c) shows the inductive coupling generation method;

FIG. 7 is a diagram showing the insertion position of the raw material wire in the plasma generation narrow tube for thin-film deposition; wherein FIG. 7(a) shows an example where the raw material wire is not inserted up to the electrode position, and FIG. 7(b) shows an example where the raw material wire is inserted up to the vicinity of the narrow tube outlet;

FIG. 9 shows the effectiveness of the reactive gas spray-type thin-film fabrication apparatus, and is a diagram showing the XPS analysis of the molybdenum oxide thin film; wherein FIG. 9(a) shows the XPS analysis of the thin film prepared under the condition of not spraying oxygen gas, and FIG. 9(b) shows the XPS analysis of the thin film prepared under the condition of spraying oxygen gas;

FIG. 10 consists of two photographs for comparison in order to demonstrate the effectiveness of the technology claimed in the present patent application; wherein FIG. 10(a) is a scanning electron micrograph showing the observation of the molybdenum oxide thin film prepared under the condition of spraying oxygen gas, and FIG. 10(b) is a scanning electron micrograph showing the observation of the molybdenum oxide thin film prepared by the method described in Patent Document 3;

FIG. 12 shows the effectiveness of the apparatus shown in FIG. 11, and is a diagram showing the XPS analysis of the molybdenum oxide thin film; wherein FIG. 12(a) shows the XPS analysis of the thin film without reactive oxygen plasma irradiation, and FIG. 12(b) shows the XPS analysis of the thin film after reactive oxygen plasma irradiation;

Figure 1:
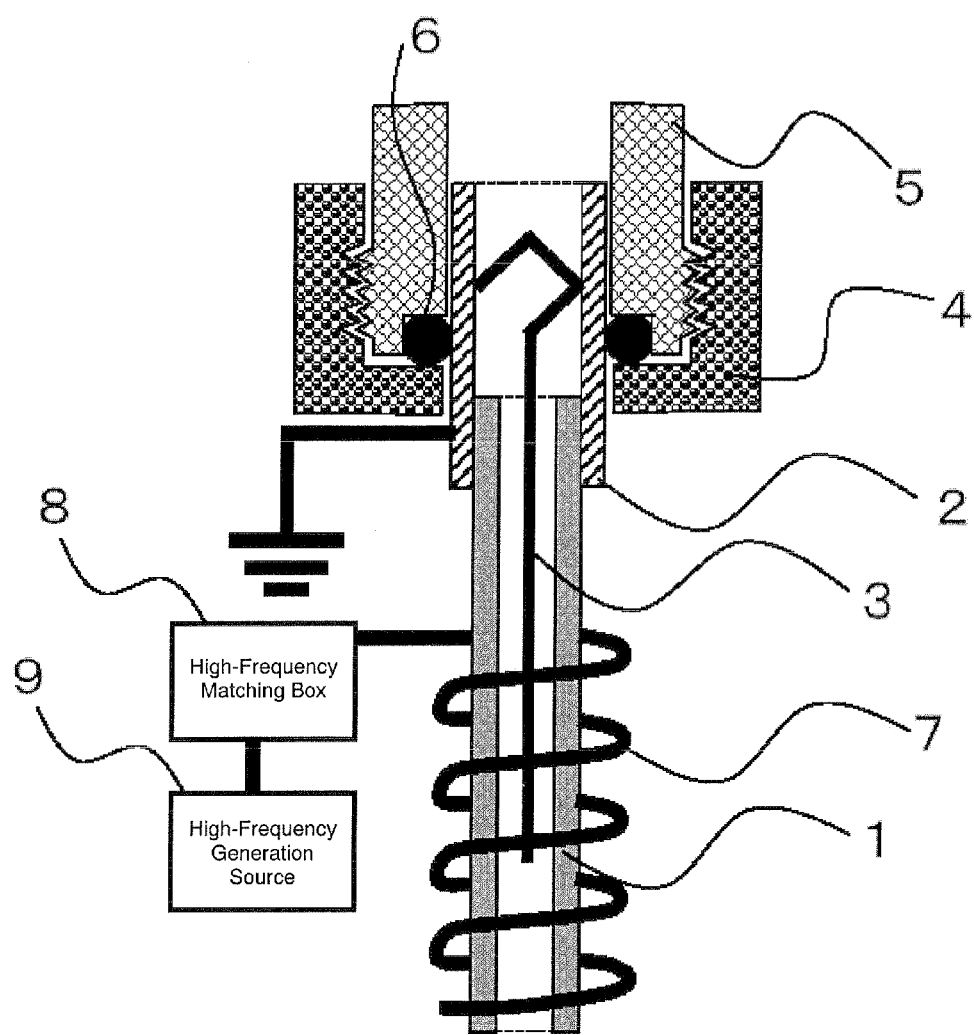
FIG. 1 is a diagram showing an example of the fixation method of the plasma generation narrow tube and the gas pipe for working the present invention.

EXPLANATION OF REFERENCES 1. insulating narrow tube
2. metal tube
3. raw material wire
4. nut
5. clamp joint
6. O ring
7. coil-shaped high-frequency application electrode
8. high-frequency matching box
9. high-frequency generation source
10. substrate for thin-film deposition
11. substrate mounting stage
12. substrate position control and scanning mechanism
13. gas inlet tube
14. clip electrode
15. plate-shaped electrode
16. reactive gas feed narrow tube
17. reactive gas feed line
18. narrow tube for plasma generation for thin-film deposition
19. raw material wire for thin-film fabrication
20. narrow tube for reactive plasma generation
21. high-melting-point precious metal wire
22. high frequency distributor
23. gas inlet tube for integrated narrow tubes
24. plate-shaped high-frequency application electrode for integrated narrow tubes

BEST MODE FOR CARRYING OUT THE INVENTION

Embodiments of the present invention are now explained in detail with reference to the attached drawings. The following embodiments are merely for facilitating the understanding of this invention, and the present invention shall in no way be limited thereby. In other words, various modifications and other embodiments based on the technical spirit of the present invention shall be included in this invention as a matter of course.

(Explanation of Atmospheric-Pressure Plasma Thin-Film Fabrication Apparatus)

FIG. 1 is a view showing a frame format of the configuration of the plasma generator pertaining to the present embodiment and the connection method to the gas pipe. The plasma generator is configured from an alumina narrow tube 1, and a metal tube 2 for supporting the alumina narrow tube. The end of a raw material wire 3 inserted into the narrow tube is fixed to the inner wall of the metal tube 2 for supporting the narrow tube. The plasma generator is connected to a gas feed pipe via an O ring clamp joint configured from components 4 to 6. Thus, since the entire plasma generator set (reference numerals 1 to 3) can be easily attached and detached, the operation is facilitated when the replacement of the plasma generator is required during the thin-film fabrication process.

One end of a coil-shaped high-frequency application electrode 7 is connected to a high-frequency generation source 9 via a high-frequency matching box 8, and the other end is left floating without being connected to anything. The coil is disposed up to the vicinity of the outlet of the alumina narrow tube, and it is therefore possible to maintain the high temperature of the plasma even near the outlet. One end of the inner raw material wire is inserted up to the center of the area where the electrode is disposed, and the other end is fixed to the inner wall of the metal tube. The raw material wire is grounded via the metal tube.

Figure 2:
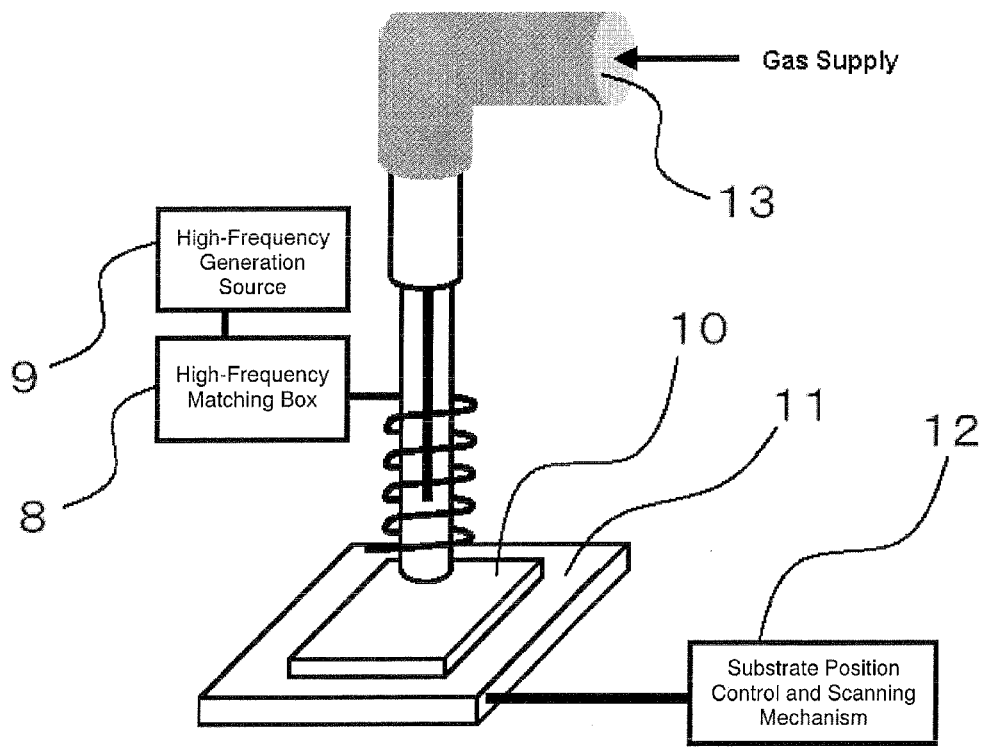
FIG. 2 is a schematic view of the atmospheric-pressure plasma thin-film fabrication apparatus.

FIG. 2 shows a schematic view of the thin-film fabrication apparatus including the plasma generation portion shown in FIG. 1. A substrate 10 to which a thin film is to be deposited is disposed at the downstream of the alumina narrow tube. Here, the distance between the narrow tube outlet and the substrate surface is controlled with using such a mechanism 12 that is capable of accurately controlling the position of the substrate as micrometer. Irradiation of plasma ejected from the narrow tube is required for fabricating a quality thin film, and the distance is desirably several mm or less. However, there may be cases where this distance is preferably several mm or more depending on the conditions for generating the plasma.

Argon gas or hydrogen and argon is supplied from the gas inlet tube 13 of FIG. 2 into the alumina narrow tube via the O ring clamp joint (reference numerals 4 to 6 of FIG. 1) and the metal tube 2 of FIG. 1, and high-frequency waves are applied to the electrode.

Subsequently, high voltage is instantaneously applied via a conductor connected to the outer wall of the alumina narrow tube to generate plasma. This yields the effect of instantaneously generating a spark in the tube by the application of high voltage and igniting the plasma. However, even without the application of high voltage, plasma is generated naturally by waiting several ten seconds in a state where the high-frequency waves are being applied. In cases where it is not possible to ignore damages to the raw material wire and the substrate disposed at the downstream of the narrow tube outlet caused by the spark discharge due to the application of high voltage, the latter method is preferably used to generate the plasma.

Once the plasma is generated, the plasma can be maintained by sustaining the application of high-frequency waves. During the plasma generation, the raw material wire inserted into the narrow tube will gradually evaporate from its surface due to the thermal conduction from the plasma or the high-frequency heating and become activated in the plasma. After these active species arrive at the substrate surface, they contribute to the thin-film deposition on the substrate.

(Optical Micrograph of Fabricated Molybdenum Thin Film)

Figure 3:
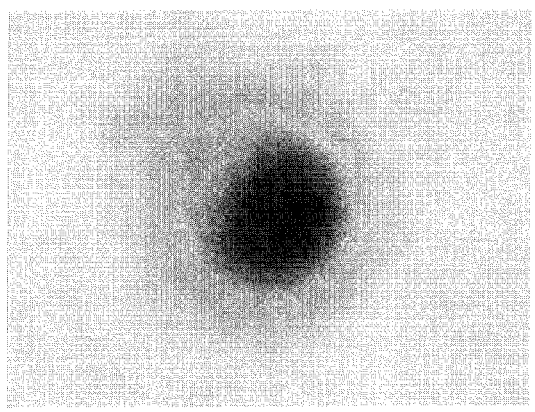
FIG. 3 is a photograph showing the observation of the deposited molybdenum oxide thin film with an optical microscope.

FIG. 3 shows an optical micrograph of the molybdenum thin film fabricated using the method and apparatus of the present invention. This thin film was prepared under the following conditions. A molybdenum wire having a diameter of 200 microns was preliminarily inserted into an alumina narrow tube having an inner diameter of 800 microns as shown in FIG. 1, and argon gas mixed with 4% hydrogen gas was supplied at a flow rate of 500 ccm.

20 W, 450 MHz high-frequency waves were applied to generate plasma, and the plasma ejected from the alumina narrow tube was irradiated for 10 minutes on an alumina substrate disposed 1 mm downstream from the narrow tube outlet. Consequently, a thin film as shown in FIG. 3 was deposited only on an area having a diameter of roughly 1 mm on the alumina substrate.

(SEM Image of Molybdenum Thin Film)

Figure 4:
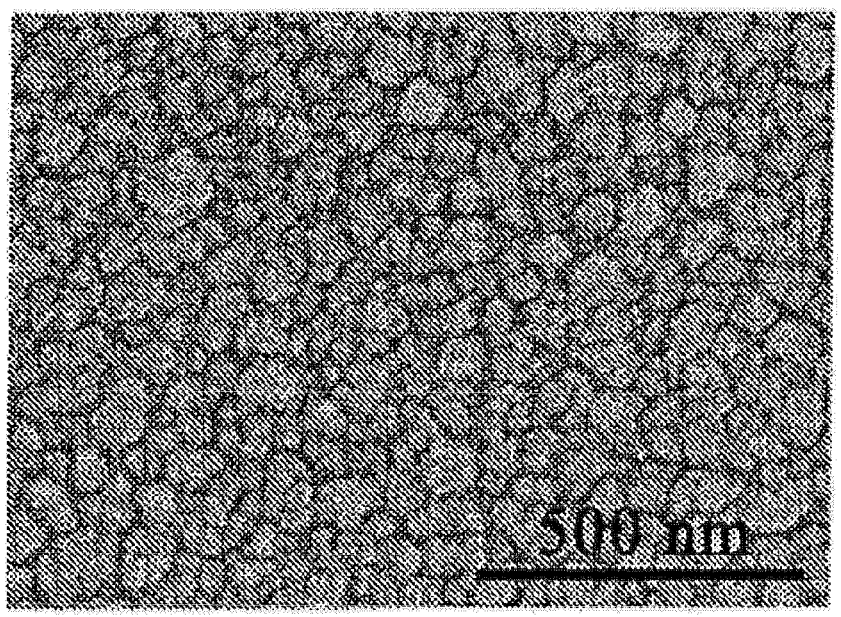
FIG. 4 is a photograph showing the observation of the deposited molybdenum thin film with a scanning electron microscope.

FIG. 4 is an SEM image of a thin film fabricated under roughly the same conditions as those indicated above, and it demonstrates that a dense thin film can be obtained by the method of the present invention.

Figure 5:
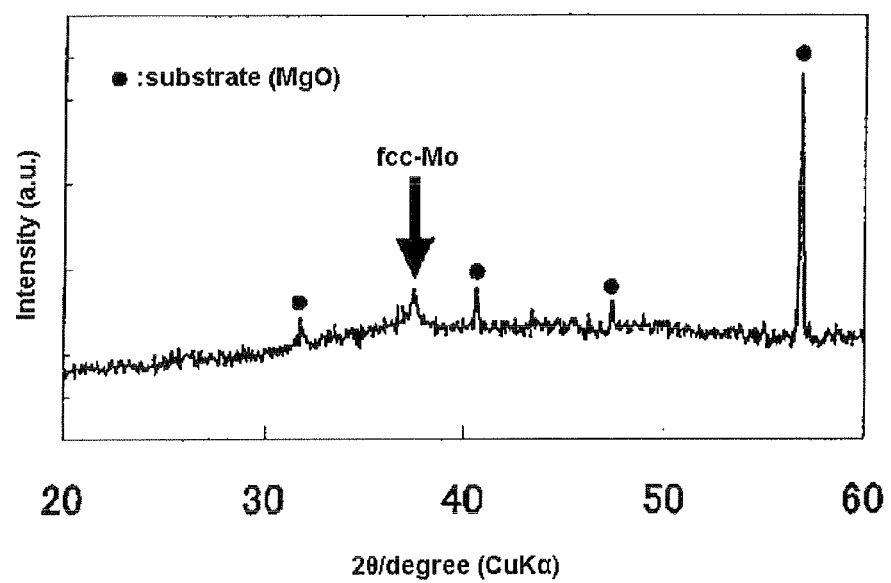
FIG. 5 is an X-ray diffraction pattern obtained from the film deposited under roughly the same conditions as the FIG. 4.

FIG. 5 is an X-ray diffraction pattern obtained from a thin film deposited on an MgO substrate under roughly the same plasma generation condition as that indicated above. Except the intensity peak derived from the MgO substrate, only the peak corresponding to metal molybdenum was observed, and the peak corresponding to molybdenum oxide was not observed. This result demonstrates that the present method is effective in fabricating a metal thin film in the atmosphere.

As described above, with the method and apparatus of the present invention, it is possible to form a thin film in the atmosphere. The foregoing method and apparatus enable to obtain, without incident, the same effects as those described above even with the following processes and specifications. Although an alumina narrow tube is used as the narrow tube, the present invention is not limited thereto. The present invention can be worked without incident so as long as the narrow tube is an insulating narrow tube.

The size of the narrow tube may be from an inner diameter of several ten microns to several millimeters if it is a straight tube. However, the size of the narrow tube is preferably 2 mm or less in consideration of stable plasma generation in the atmosphere.

Although the high-frequency waves to be applied for generating and maintaining the plasma exemplified herein as 450 MHz, the same effects as those indicated above can be yielded without incident so as long as the high frequency is in the range of 50 to 800 MHz.

Figure 6:
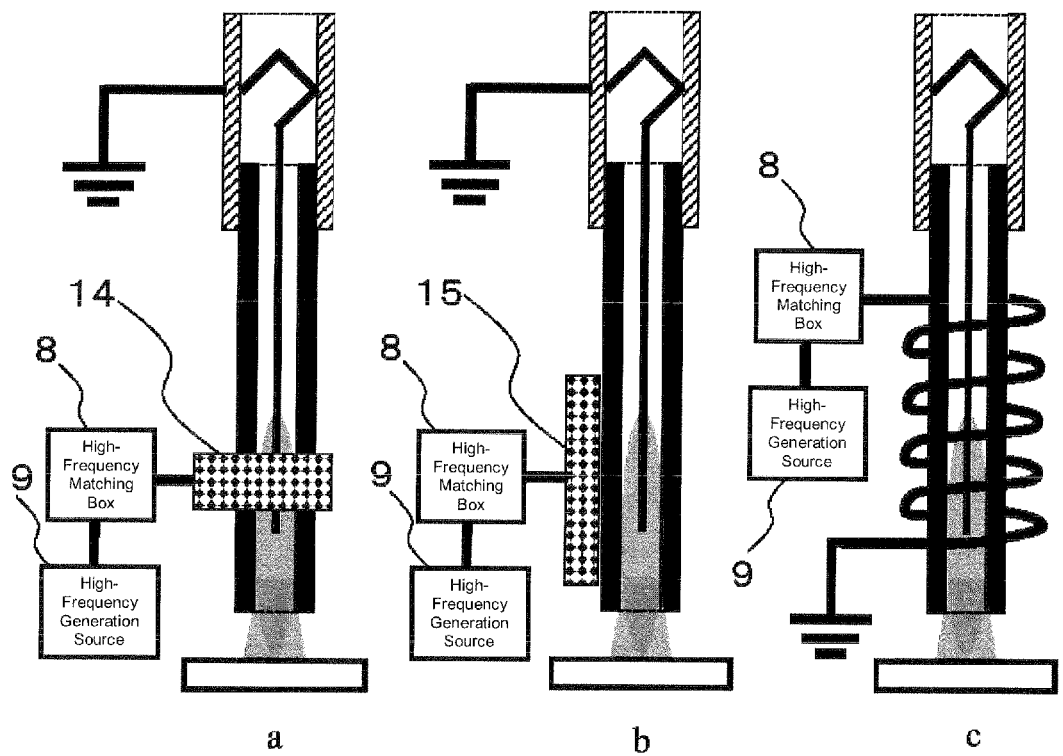

Although the high-frequency application electrode exemplified herein is of a coil shape, the present invention is not limited thereto. The same effects are yielded even when using a metal tube as a substitute for the coil. In addition, it is also possible to use an electrode in the shape of a crocodile clip and sandwich the narrow tube as shown in FIG. 6($a$) to yield the same effects. Moreover, as shown in FIG. 6($b$), it is also possible to dispose a metal plate adjacent to the narrow tube and use it as an electrode to yield the same effects.

In these examples of generating plasma, as with the example of FIG. 1, it is desirable that the raw material wire in the narrow tube is grounded via the metal tube. As a result of this grounding, the high-frequency waves applied from the electrode will be propagated to the wire, and the plasma can be maintained based on capacitive coupling. Nevertheless, there are cases where the generation of plasma is maintained and similar effects are yielded even without grounding the wire.

Moreover, as shown in FIG. 6($c$), the method of grounding the other end of the coil electrode illustrated in FIG. 1 is also effective. As a result of this grounding, the generation of plasma is maintained based on inductive coupling, and the raw material wire in the narrow tube is efficiently heated and evaporated based on the inductive heating. Here, it is not necessary to ground the metal wire.

Figure 7:
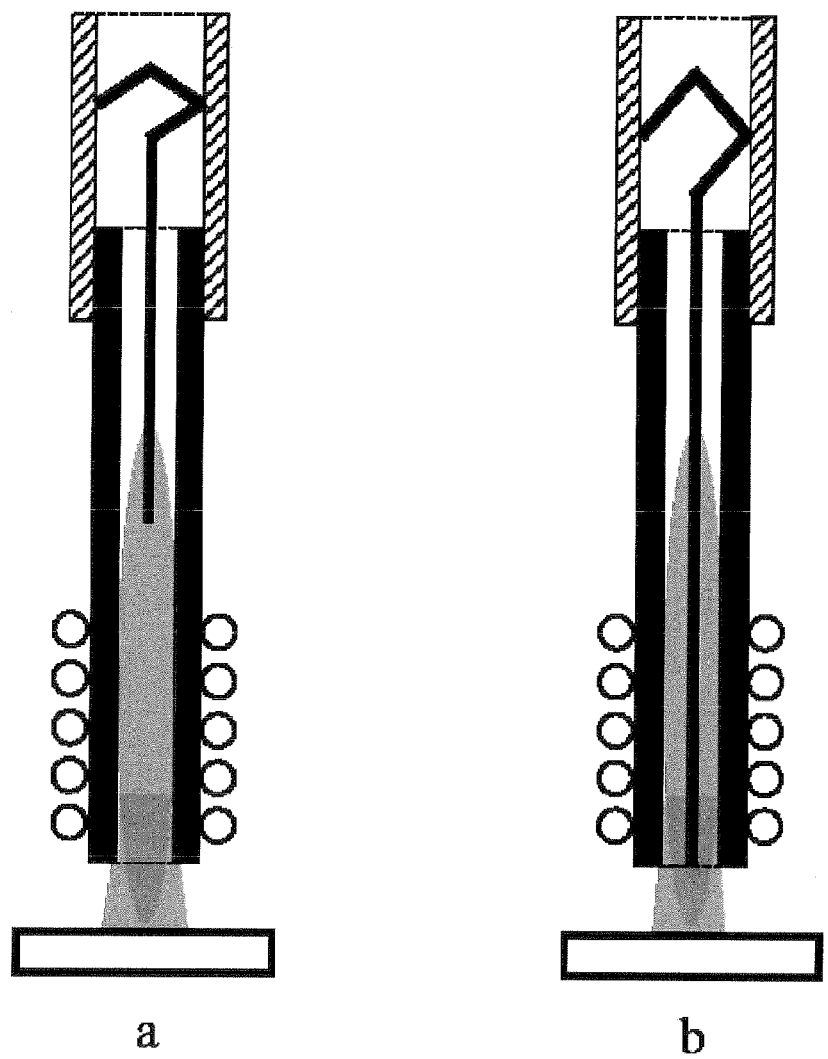

With regard to the insertion position of such raw material wire, although the present example (FIG. 1) shows the raw material wire being inserted up to the center of the area where the electrode is set, the present invention is not limited thereto. As shown in FIG. 7($a$), similar effects are yielded even under the conditions and specification where the raw material wire is not inserted up to the area where the electrode is disposed. In this case, the plasma is generated from the tip of the wire toward the electrode and ejected from the narrow tube outlet as illustrated in FIG. 7($a$). Contrarily, the same effects are yielded even if the raw material wire is inserted up to the vicinity of the narrow tube outlet as shown in FIG. 7($b$).

Although the present example illustrating a case of supplying argon as the gas to be supplied, it goes without saying that other gases such as helium can also be used as needed.

Moreover, the introduction of hydrogen into the plasma yields the effect of promoting the evaporation of the raw material wire. The introduction of hydrogen will lead to the rise in plasma enthalpy and rise in thermal conductivity, and yield the effect of efficiently heating the substrate by way of plasma irradiation.

The method of the present invention is also effective in fabricating a metallic-compound thin film, and a thin film of metal oxide or nitride can be easily fabricated by introducing oxygen or nitrogen gas into the plasma.

As evident from the foregoing explanation, according to the method pertaining to the present embodiment, it is possible to easily fabricate a metal or metallic-compound thin film in the atmosphere.

The high-efficiency deposition method, apparatus and examples of the metallic-compound thin film applying the foregoing atmospheric-pressure plasma thin-film fabrication apparatus are now explained. The present method is different from the method described above, and the embodiment is explained based on the schematic view of the apparatus illustrated in FIG. 8. Incidentally, in FIG. 8, although the plasma generator illustrated in FIG. 1 is explained as the representative example, any combination of the methods shown in FIG. 1 to FIG. 7 can be used. It is obvious that these combinations are also able to yield the same effects as those explained below, and the present invention covers all of these aspects.

With this apparatus (FIG. 8), a reactive gas feed narrow tube 16 is disposed in the vicinity of the outlet of the narrow tube for plasma generation. Although the reactive gas feed narrow tube is preferably insulating so that it will not affect the plasma generation, since the influence is minimal, the same effects are yielded even when using a metal tube. The narrow tube is connected to a gas feed line 17. The reactive gas feed narrow tube is disposed diagonally against the area to be subject to plasma irradiation and thin-film deposition, but the same effects are yielded even if it is disposed orthogonally to the narrow tube for plasma generation; that is, horizontally to the substrate surface.

The example of the molybdenum oxide thin film fabricated with the present apparatus (FIG. 8) is now explained.

A molybdenum wire having a diameter of 200 microns was preliminarily inserted into a narrow tube (reference numeral 1) for plasma generation having an inner diameter of 800 microns, and plasma was generated by applying 25 W high-frequency waves while supplying argon gas at a flow rate of 500 ccm. Simultaneously with irradiating the plasma ejected from the alumina narrow tube on the alumina substrate 10 disposed 1 mm downstream from the outlet of the narrow tube for plasma generation, oxygen gas was supplied to the gas feed narrow tube 16 at a flow rate of 500 ccm, and oxygen gas was sprayed to the plasma irradiation part on the substrate.

Figure 9:
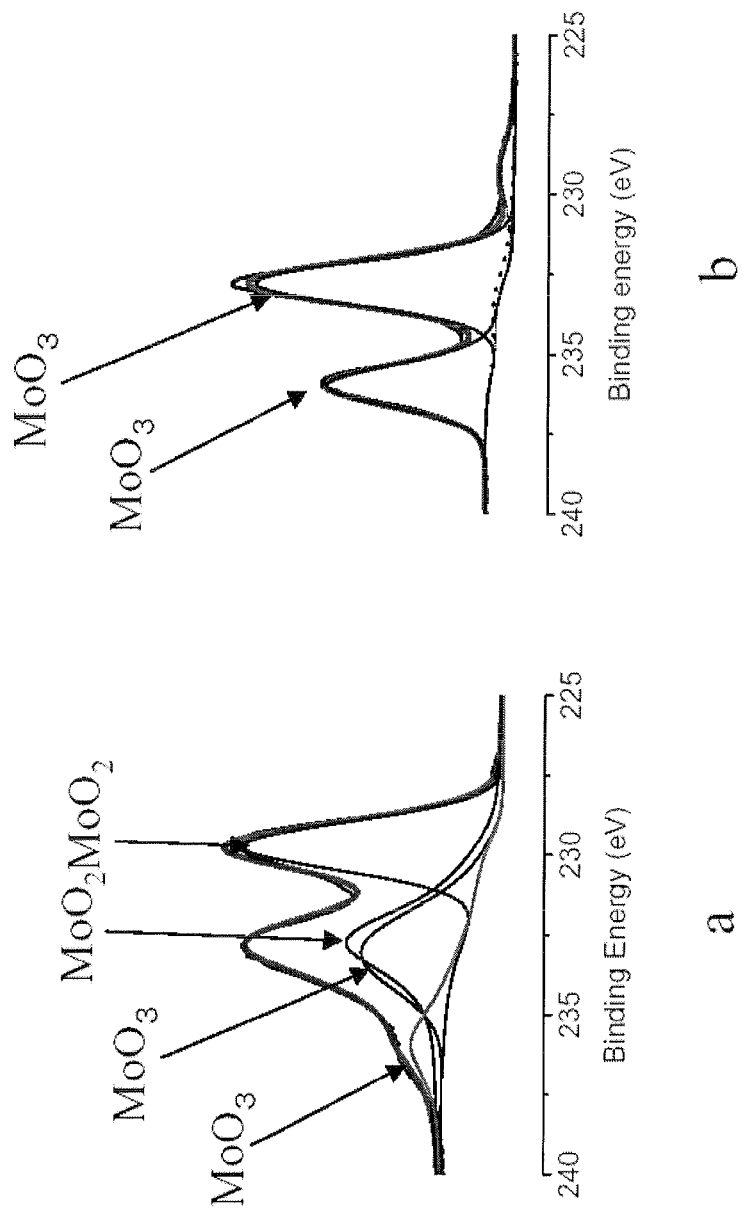

The XPS analysis of the thin film composition that verifies the effect of the foregoing fabrication method and process is shown in FIG. 9. FIG. 9(a) shows the analysis of the thin film fabricated under the conditions of not spraying oxygen, and the film contains significant amounts of metal molybdenum phases and low oxidation state phases of $MoO_2$ and the like. Meanwhile, FIG. 9(b) shows the analysis of the thin film obtained as a result of irradiating plasma for 40 minutes while spraying oxygen gas, and it is evident that the film is composed roughly of a single phase of $MoO_3$.

Figure 10:
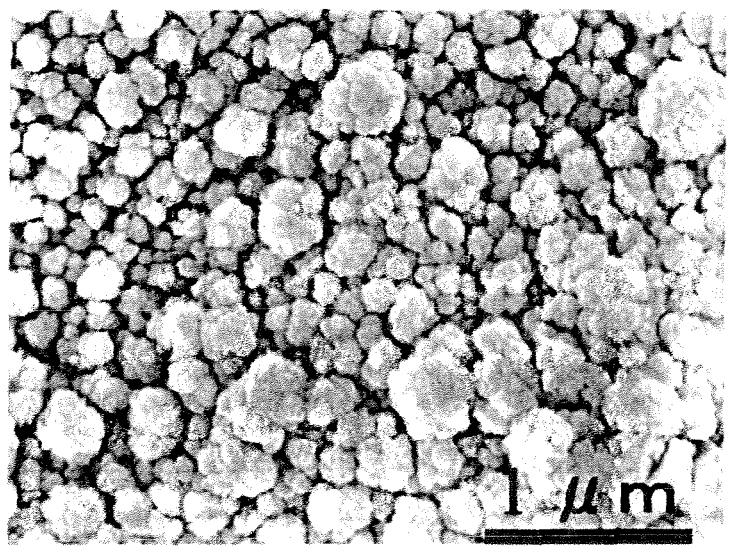
Figure 10:
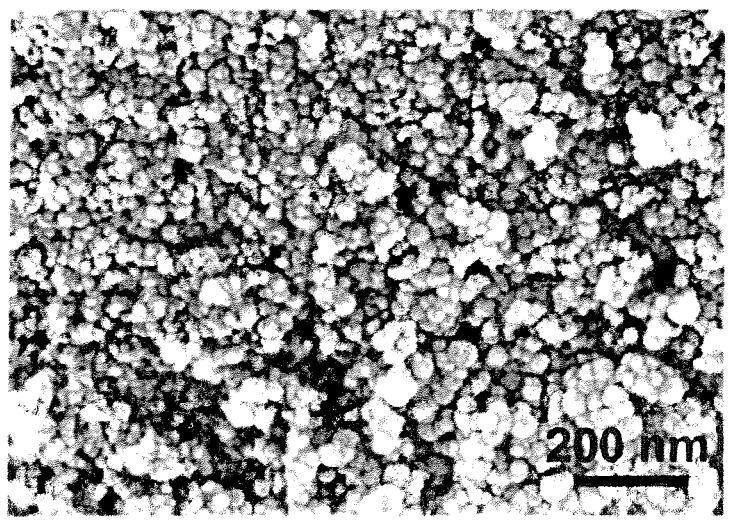

FIG. 10(a) is a scanning electron micrograph of a MoO3 film fabricated by roughly the same method as that indicated above. For comparison, FIG. 10(b) shows a scanning electron micrograph of a MoO3 film synthesized and deposited on the substrate by the method described in Patent Document 3. It can be seen that the particles having a diameter of 20 nm are deposited through the method described in Patent Document 3. However, under the technology claimed in the present patent application, such phenomenon as sintering occurs by plasma irradiation and heating after the particle deposition, contributing to the formation of spherical particles having a size of several hundred microns, and it can be seen that the particles are deposited densely. Also, the particles have a good adhesiveness, and therefore, it has now verified a heating effect of the deposition material by plasma irradiation onto the substrate surface in the technology claimed in the present patent application.

As described above, by introducing oxygen gas from the side face of the plasma ejected from the narrow tube in the thin-film fabrication process, it is possible to efficiently fabricate a metal oxide thin film of an equilibrium composition.

Although the oxide thin-film fabrication method based on the spraying of oxygen gas was exemplified above, the present invention is not limited thereto. If the type of gases for spraying are selected, the thin film deposition of other metallic compounds will also be possible. For instance, if the same process is performed while spraying nitrogen gas, it goes without saying that nitride can be obtained.

The method for fabricating a metallic-compound thin film using an apparatus that combines the foregoing atmospheric-pressure plasma thin-film fabrication method and the reactive atmospheric-pressure plasma, and the apparatus thereof are now explained. The present method is different from the methods described above, and the embodiment is explained based on the schematic view of the apparatus illustrated in FIG. 11. Incidentally, in FIG. 11, although the plasma generation part illustrated in FIG. 1 is explained as the representative example, any combination of the methods shown in FIG. 1 to FIG. 7 can be used. It is obvious that these combinations are also able to yield the same effects as those explained below, and the present invention covers all of these aspects.

The present apparatus is configured from two narrow tubes for plasma generation, and one narrow tube 18 is used for performing the thin-film deposition process, and a wire 19 as the raw material for deposition is inserted therein. The other narrow tube 20 is used for generating a reactive atmospheric-pressure plasma, and is not used for the thin-film deposition. A high-melting-point precious metal wire 21 that does not react with a reactive gas is inserted therein.

Electrodes for applying high-frequency waves are disposed in both narrow tubes. A high frequency distributor 22 is connected between the electrodes and a matching box, and, by flip of a switch, high-frequency waves can be applied only to the narrow tube for generating plasma, or high-frequency waves can be applied to both narrow tubes.

The plasma generated in the narrow tube can be ejected from the outlet and directly irradiated to the thin-film deposition area. In the metallic-compound thin-film fabrication method, the thin-film deposition is performed using the narrow tube 18 in the first step and a metallic-compound thin film of an equilibrium composition is fabricated by heating and causing the deposited thin film to react with reactive plasma irradiation using the narrow tube 20 in the second step.

(Fabrication of Molybdenum Oxide Thin Film Using the Apparatus)

In the first process, the molybdenum wire 19 having a diameter of 200 microns was preliminarily inserted into the alumina narrow tube 18 having an inner diameter of 800 microns, and argon gas mixed with 4% hydrogen gas was supplied at a flow rate of 500 ccm. 20 W high-frequency waves were applied to generate plasma, and the plasma ejected from the alumina narrow tube was irradiated for 10 minutes on the alumina substrate 10 disposed 1 mm downstream from the narrow tube outlet. A thin film having a diameter of roughly 1 mm similar to those as shown in FIG. 3 and FIG. 4 was deposited on the alumina substrate.

After the completion of the first step, the supply of gas and the like used in the first step was completely stopped, and the routine proceeds to the second step using the narrow tube 20. This narrow tube is made of alumina and has an inner diameter of 800 microns, and a platinum wire 21 having a diameter of 300 microns was inserted therein. 500 ccm of argon gas mixed with 200 ppm of oxygen gas was supplied, and 5 W high-frequency waves were applied to generate plasma. The plasma ejected from the narrow tube was directly irradiated for 20 minutes on the thin film disposed roughly 1 mm downstream from the narrow tube outlet.

Figure 12:
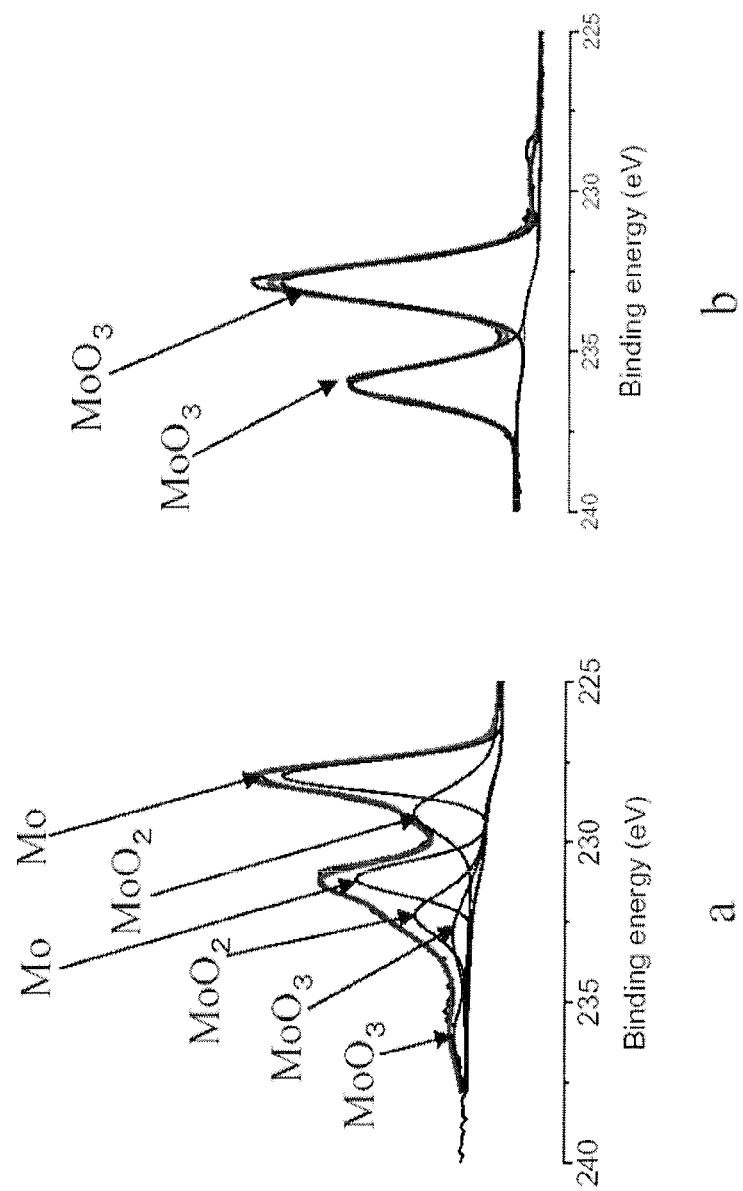

When comparing the case of using only the first step and the case of using both steps, a difference in the composition of the formed thin film can be seen. Data that verifies the effect of the present apparatus and method is shown in FIG. 12. This data represents the thin film composition based on XPS. FIG. 12(a) shows the analysis obtained from a thin film fabricated with only a single-step process, and the film contains large amounts of metal molybdenum phases and low oxidation state phases. Meanwhile, FIG. 12(b) shows the analysis of the thin film obtained based on the foregoing two-step process, and it is evident that the film hardly contains any metal molybdenum phase or low oxidation state phase, and is configured mostly from a single phase of $MoO_3$.

As described above, by employing the two-step process using reactive plasma in the thin-film fabrication process, it has been verified that a metal oxide thin film of an equilibrium composition can be fabricated efficiently. Although an oxide thin-film fabrication method based on a two-step process using reactive oxygen plasma was exemplified above, the present invention is not limited thereto. If the type of gases to be introduced into the plasma used in the second process are selected, thin films of other metallic compounds can also be formed.

Figure 11:
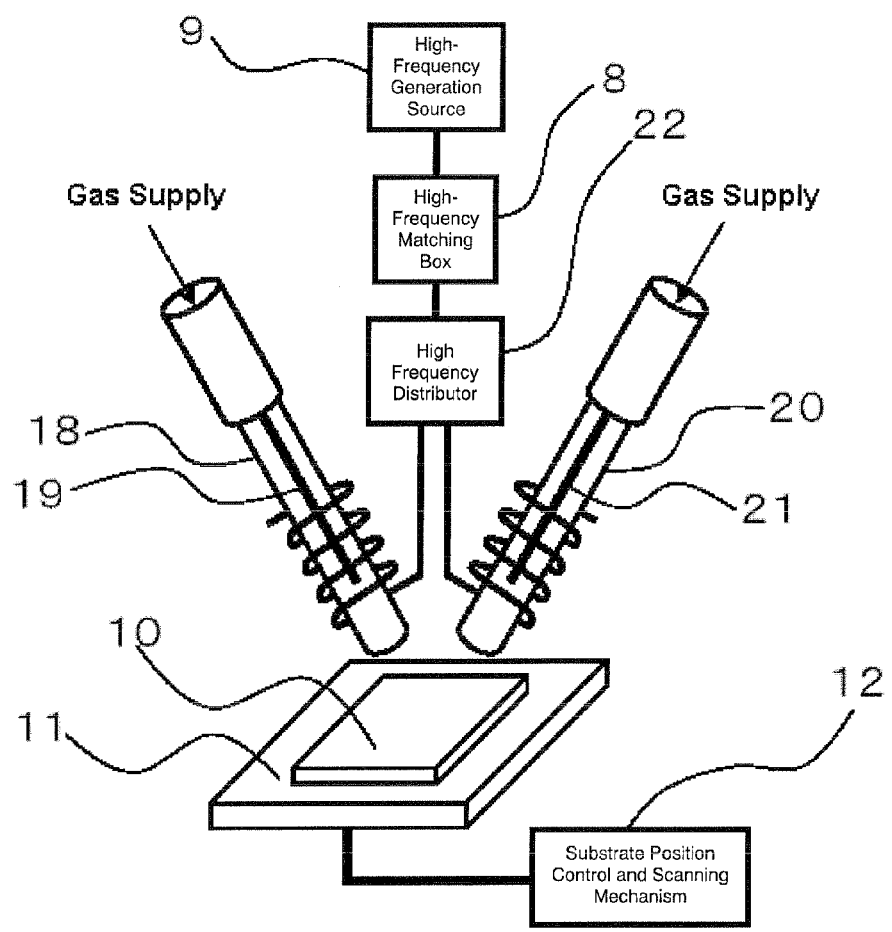
FIG. 11 is a schematic view of the thin-film fabrication apparatus that concurrently includes a plasma generator and a reactive plasma generator for thin film deposition.

Further, the present invention is also effective in fabricating a metallic-compound thin film by simultaneously generating both plasmas without separating the processes into two steps. The nozzles may also be replaced in each process without arranging two narrow tubes as shown in FIG. 11. It is also effective to use a rotation-type nozzle position control apparatus.

(Explanation of Large-Area Thin-Film Fabrication Method Using the Apparatus)

Figure 8:
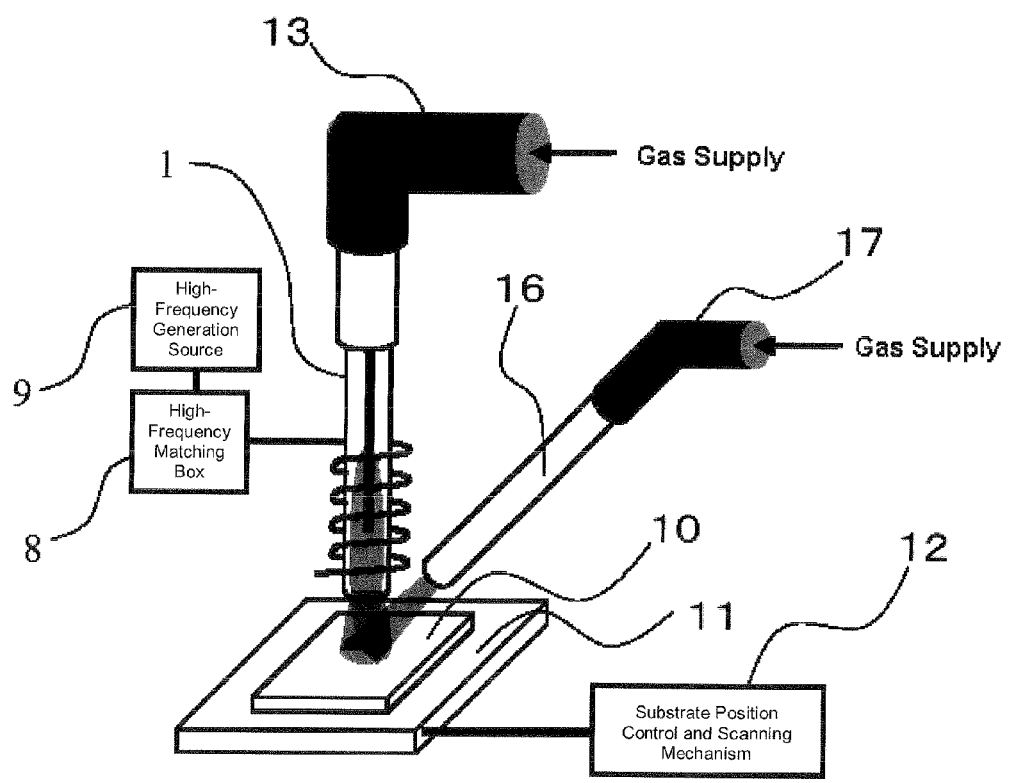
FIG. 8 is a schematic view of the reactive gas spray-type thin-film fabrication apparatus.

The large-area thin-film fabrication method applying the foregoing thin-film fabrication technology is now explained using a view of the frame format. The method of fabricating the large-area thin film using the apparatuses illustrated in FIG. 2, FIG. 8, and FIG. 11 is explained.

In the thin-film fabrication process described above, after generating plasma from the status of FIG. 13(a), the substrate is scanned in the direction of the arrows shown in the drawings in the order of FIG. 13(b)→FIG. 13(c)→FIG. 13(d). As a result of repeating the scanning showing in the drawings, it is possible to form a film having the desired thickness and quality.

(Fabrication of Molybdenum Oxide Thin Film Using Large-Area Thin-film Fabrication Method)

Figure 13:
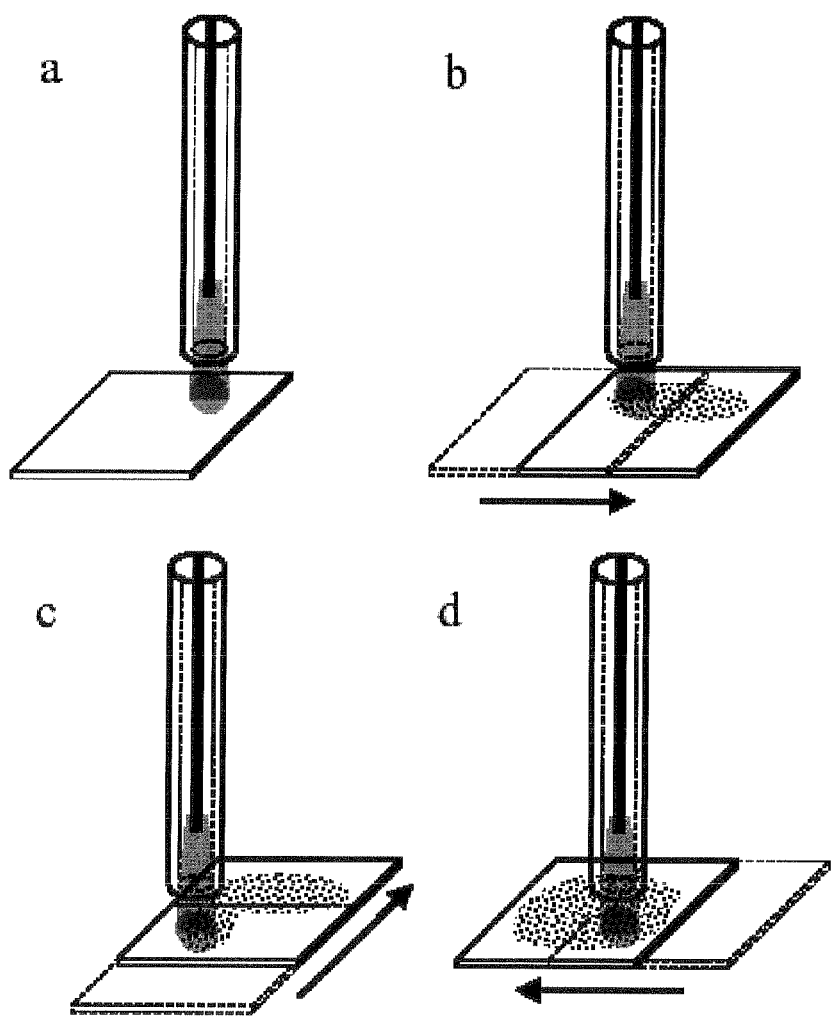
FIG. 13(a) to FIG. 13(d) are conceptual diagrams of the large-area thin-film fabrication method employing the substrate scanning method.

A molybdenum wire having a diameter of 200 microns was preliminarily inserted into a narrow tube for plasma generation having an inner diameter of 800 microns, and plasma was generated by applying 25 W high-frequency waves while supplying argon gas mixed with 2% hydrogen at a flow rate of 1 slm. While irradiating the plasma ejected from the alumina narrow tube on the alumina substrate disposed 1 mm downstream from the outlet, the substrate was scanned 200 times across an area of roughly 2 mm×4 mm as illustrated in FIG. 13.

Figure 14:
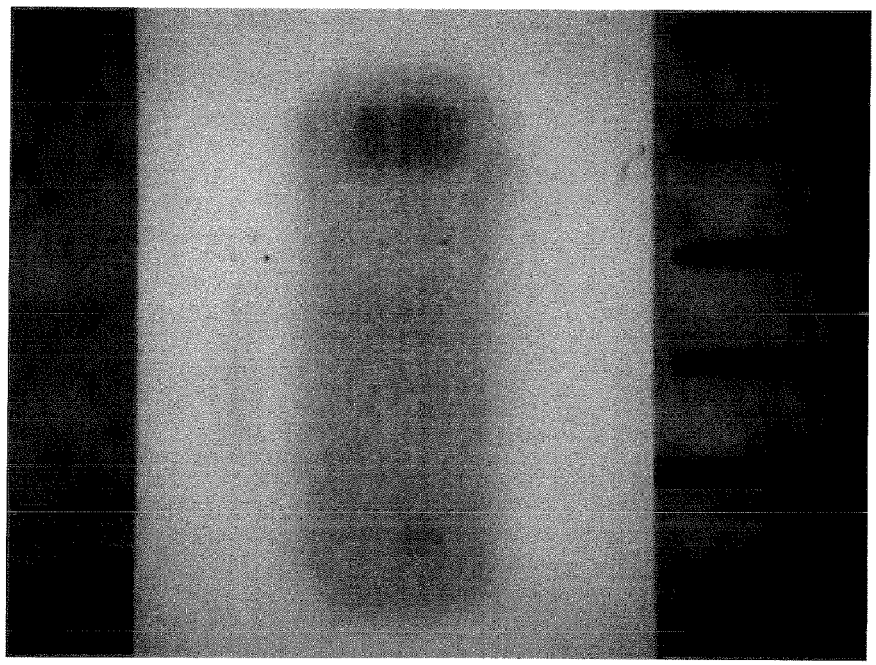
FIG. 14 is an optical micrograph showing the observation of the molybdenum oxide thin film prepared by the substrate scanning method.

FIG. 14 is an optical micrograph of the obtained thin film, and shows that the thin film was deposited on the area that was scanned while being subject to plasma irradiation. The fact that the thin film fabricated with this kind of method is a seamless and continuous film is obvious from the results of the following conductivity measurement. As a result of disposing electrodes on both ends of the large-area thin film fabricated under roughly the same conditions as FIG. 14 and measuring the conductivity based on the 2-terminal method, although it possess high resistivity of roughly 30 GΩ·cm, the flow of current was confirmed.

Further, in order to demonstrate that the thin film fabricated with the atmospheric-pressure plasma apparatus is effective as an application of a gas sensor element and the like, an ammonia gas response test of a large-area thin film fabricated under roughly the same conditions as the thin film illustrated in FIG. 14 was conducted. Prior to conducting this test, the thin film fabricated with the present apparatus and method was annealed for 20 minutes at 320° C. in the atmosphere to stabilize the chemical composition.

The chemical composition stabilization by atmospheric anneal of the oxide thin film for use in a gas sensor is a process that is employed to all thin films regardless of how they were fabricated, and it does not mean that the present method is inferior to other thin-film fabrication methods.

Figure 15:
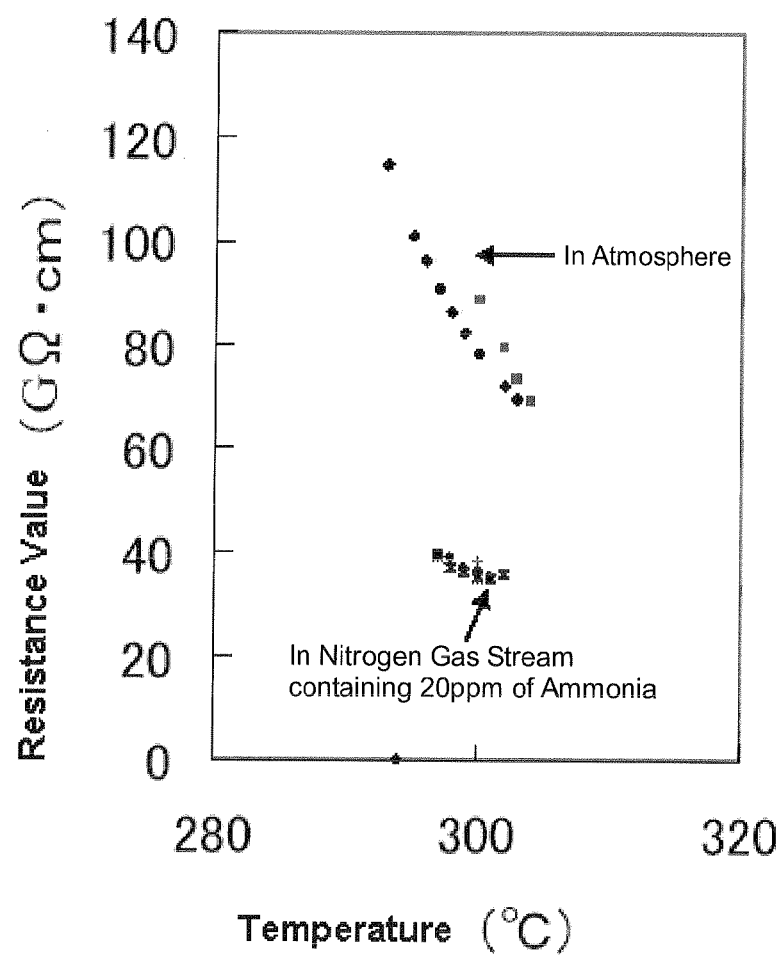
FIG. 15 is a diagram showing the electrical resistance measurement result of the molybdenum oxide thin film prepared by the substrate scanning method in the atmosphere and ammonia-containing nitrogen stream.

Electrodes were disposed at both ends of the annealed thin film, and the electrical resistance values of the thin film in the air atmosphere and in a nitrogen gas stream containing 20 ppm of ammonia were measured under the environment of roughly 300° C., and compared. FIG. 15 shows the results of the resistance measurement. Whereas the thin film resistance in the vicinity of 300° C. was 83 to 94 GΩcm in the air atmosphere, it was 36 to 40 GΩcm in the ammonia-containing nitrogen stream. According to the following sensor sensitivity evaluation formula where sensitivity(%)=$[(Ra-Rg)/Ra]\times 100$(wherein $Ra$ is the resistance in air and $Rg$ is the resistance in the measured gas),the thin film fabricated with the present apparatus and method shows sensitivity of roughly 60%.

As described above, it has been confirmed that the thin film fabricated with the present apparatus and method yields sufficient functions even in the application of the thin film; that is, it is evident that the apparatus and method of the present invention are effective as or in a large-area thin-film fabrication apparatus.

Although the substrate was scanned in the foregoing embodiment of fabricating the thin film, it goes without saying that a large-area thin film can also be fabricated with a method of fixing the substrate and scanning the plasma generation narrow tube. In addition, the arrangement of the plasma generation narrow tube, the generation method and the position for disposing the raw material wire are possible through any combination of the methods illustrated in FIGS. 2, 6, 7, 8 and 11.

(Fabrication of Large-Area Thin Film with Integrated Plasma Generation Narrow Tubes)

The method and apparatus to be applied in fabricating a large-area thin film by integrating the narrow tubes for plasma generation are now explained with reference to the schematic view of the apparatus illustrated in FIG. 16.

Figure 16:
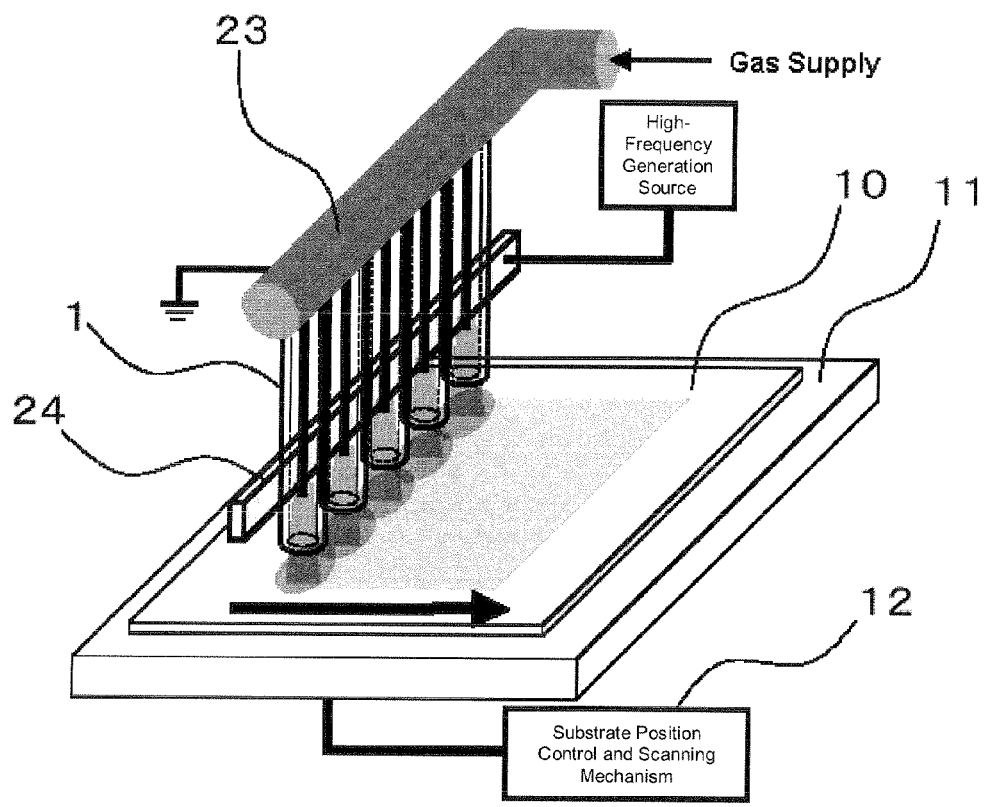
FIG. 16 is a schematic view of the large-area thin-film fabrication apparatus with the integrated narrow tubes.

The insulating narrow tubes 1 for plasma generation are arranged in parallel as illustrated in FIG. 16 and are fixed, for instance, to the side face of the gas inlet tube. The terminal of the gas inlet tube is closed, and the supplied gas is entirely fed to inside the narrow tubes. The method of disposing the electrodes for applying the high-frequency waves for generating and maintaining the plasma could be any of the methods depicted in FIG. 2, FIG. 6 and FIG. 7. FIG. 16 illustrates a method of using the metal plate shown in FIG. 6(b) as the electrode. A plate electrode is advantageous in that it is relatively easy to deal with the high integration of narrow tubes; that is, the increase in the number of narrow tubes. The position for disposing the raw material wire and the like could be any of the methods depicted in FIG. 1 to FIG. 7.

Figure 17:
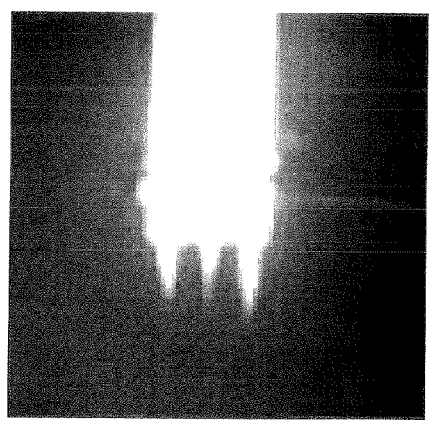
FIG. 17 is a photograph showing the appearance of the atmospheric-pressure plasma generated with the integrated narrow tubes.

FIG. 17 shows the integration of three narrow tubes and the plasma generation, and a large-area thin film can be fabricated by irradiating the plasma to the substrate in this state and scanning the substrate as shown in FIG. 16.

As described above, a large-area thin film can be fabricated by integrating the narrow tubes for plasma generation and generating plasma. Here, although integration based on one-dimensional alignment of the narrow tubes as shown in FIG. 16 was exemplified, it is also possible to integrate the narrow tubes based on two-dimensional alignment and fabricate a large-area thin film.

The invention claimed is:

1. A thin-film fabrication method by microplasma processing, comprising the steps of:
   disposing a raw material for thin-film fabrication in one or more narrow tubes (A) having a uniform inner diameter of 2 mm or less;
   introducing an inert gas and applying a high-frequency voltage to the one or more narrow tubes (A) to generate high-frequency plasma in the one or more narrow tubes (A);
   heating the raw material to evaporate the raw material while maintaining flow rate of plasma gas in the one or more narrow tubes (A) and maintaining the plasma gas temperature high;
   ejecting the evaporated material with the high-frequency plasma from the one or more narrow tubes (A) to spray it onto a substrate;
   heating the substrate with the ejected plasma; and
   depositing the evaporated material sprayed on the substrate during the ejecting step under atmospheric pressure.

2. The thin-film fabrication method by microplasma processing according to claim 1, wherein hydrogen gas is introduced together with the inert gas into the one or more narrow tubes (A) to generate high-temperature plasma.

3. The thin-film fabrication method by microplasma processing according to claim 1, wherein a high-frequency application electrode is disposed up to an area in a vicinity of an outlet of the one or more narrow tubes (A) to maintain the plasma gas temperature high.

4. The thin-film fabrication method by microplasma processing according to claim 1, wherein the raw material to fabricate a thin film on the substrate is metal or alloy wire.

5. The thin-film fabrication method by micro plasma processing according to claim 1, wherein the substrate and the one or more narrow tubes (A) for plasma generation used for spraying the evaporated material on the substrate are subject to relative displacement so as to control thickness, substance and area of a film being deposited.

6. The thin-film fabrication method by microplasma processing according to claim 1, wherein a plurality of the narrow tubes (A) for plasma generation used for spraying the evaporated material on the substrate are aligned along the substrate and the substrate and the narrow tubes (A) are subject to relative displacement so as to control thickness, substance and area of a film being deposited and form a large-area thin film.

7. The thin-film fabrication method by microplasma processing according to claim 1, wherein a heterogeneous material is ejected from a plurality of the narrow tubes (A) and sprayed on the substrate, the substrate is heated due to the plasma irradiation, and a composite material or a compound fabricated from the sprayed heterogeneous material is deposited on the substrate under atmospheric pressure.

8. The thin-film fabrication method according to claim 3, wherein the electrode is coil-shaped and has one end connected to a high frequency generation source and an opposite floating free end without connection.

9. A thin-film fabrication method by micro plasma processing, comprising the steps of:
   disposing a raw material for thin-film fabrication in one or more narrow tubes having a uniform inner diameter of 2 mm or less (A);
   introducing an inert gas and applying a high-frequency voltage to the one or more narrow tubes (A) to generate high-frequency plasma in the one or more narrow tubes (A);
   heating the raw material in the one or more narrow tubes (A) to evaporate the raw material while maintaining flow rate of plasma gas in the one or more narrow tubes (A) and maintaining the plasma gas temperature high;
   ejecting the evaporated material with the high-frequency plasma from the one or more narrow tubes (A) to spray it onto a substrate;
   heating the substrate with the plasma; and
   causing the material deposited on the substrate to react with reactive gas to form a compound of the material by irradiating a reactive gas on the substrate from a side face with use of one or more narrow tubes (B) other than the one or more narrow tubes (A).

10. A thin-film fabrication method by microplasma processing, comprising the steps of:
   disposing a raw material for thin-film fabrication in a tube (A);
   introducing an inert gas in the tube (A) and applying a high-frequency voltage to the tube (A) to generate a high-frequency plasma in the tube (A);
   heating the raw material in the tube (A) to evaporate the raw material in the tube (A) while maintaining flow rate of plasma gas in the tube (A) and while maintaining plasma gas temperature;
   ejecting the evaporated material with the high-frequency plasma from the tube (A) to spray the evaporated material onto a substrate:
   heating the substrate with the plasma; and
   causing the material deposited on the substrate by the ejecting step to react with a reactive gas to form a compound of the material by irradiating the reactive gas on the substrate from a tube (B) other than the tube (A), the reactive gas being oxygen or nitrogen, and a thin film formed thereby being metal oxide or metal nitride.

11. The thin-film fabrication method according to claim 10, wherein hydrogen gas is introduced into the tube (A) with the inert gas during said introducing step.

12. The thin-film fabrication method according to claim 10, wherein a high-frequency application electrode is disposed adjacent an outlet of the tube (A).

13. The thin-film fabrication method according to claim 10, wherein the raw material disposed in the tube (A) during said disposing step is metal wire or metal alloy wire.

14. The thin-film fabrication method according to claim 10, further comprising the step of subjecting the substrate and the tube (A) to relative displacement during said ejecting step so as to control a thickness, substance and area of the film being deposited on the substrate.

15. The thin-film fabrication method according to claim 10, wherein the tube (A) comprises a plurality of tubes (A), and further comprising the steps of aligning the plurality of tubes (A) with the substrate and subjecting the substrate and the plurality of tubes (A) to relative displacement so as to control a thickness, substance and area of the film being deposited.

16. The thin-film fabrication method according to claim 10, wherein the tube (A) comprises a plurality of tubes (A), and wherein a heterogeneous material is ejected from the plurality of the tubes (A) and sprayed onto the substrate under atmospheric pressure.

* * * * *